United States Patent [19]

Parks

[11] 4,283,754
[45] Aug. 11, 1981

[54] COOLING SYSTEM FOR MULTIWAFER HIGH DENSITY CIRCUIT

[75] Inventor: Howard L. Parks, Woodland Hills, Calif.

[73] Assignee: Bunker Ramo Corporation, Oak Brook, Ill.

[21] Appl. No.: 23,968

[22] Filed: Mar. 26, 1979

[51] Int. Cl.³ .............................................. H05K 7/20
[52] U.S. Cl. .................................... 361/382; 361/385; 361/386; 357/82
[58] Field of Search ......... 339/112 R, 112 L, 17 LM, 339/17 M, 17 N; 361/382, 385, 386, 388, 403, 410, 412, 414; 174/15 R, 16 HS, 68.5; 357/75, 81, 82

[56] References Cited

U.S. PATENT DOCUMENTS

| 3,346,773 | 10/1967 | Lomerson | 361/386 |
| 3,631,325 | 12/1971 | Wenz | 361/386 |
| 3,648,113 | 3/1972 | Rathjen | 361/382 |
| 3,917,983 | 11/1975 | Kuronen | 361/414 |
| 4,019,098 | 4/1977 | McCready | 361/385 |
| 4,107,760 | 8/1978 | Zimmer | 361/412 |

Primary Examiner—Gerald P. Tolin
Attorney, Agent, or Firm—F. M. Arbuckle; A. Freilich

[57] ABSTRACT

A high density arrangement for interconnecting integrated circuit devices, of a type which includes a stack of numerous wafers formed primarily of metal, wherein some of the wafers holding integrated circuit chips have overhanging edge portions at one side of the stack that extend beyond other wafers of the stack, and wherein there are cooling fluid tubes clamped against the overhanging edge portions to carry away heat to a cooling fluid flowing through the tube. The wafers are interconnected at numerous locations by button portions of malleable material such as gold, and the stack of wafers are clamped together to slightly deform the button portions to provide a considerable area of contact. The stack clamping device is separate from the cooling fluid tube clamping device, to provide different degrees of pressure and compressive strain.

6 Claims, 14 Drawing Figures

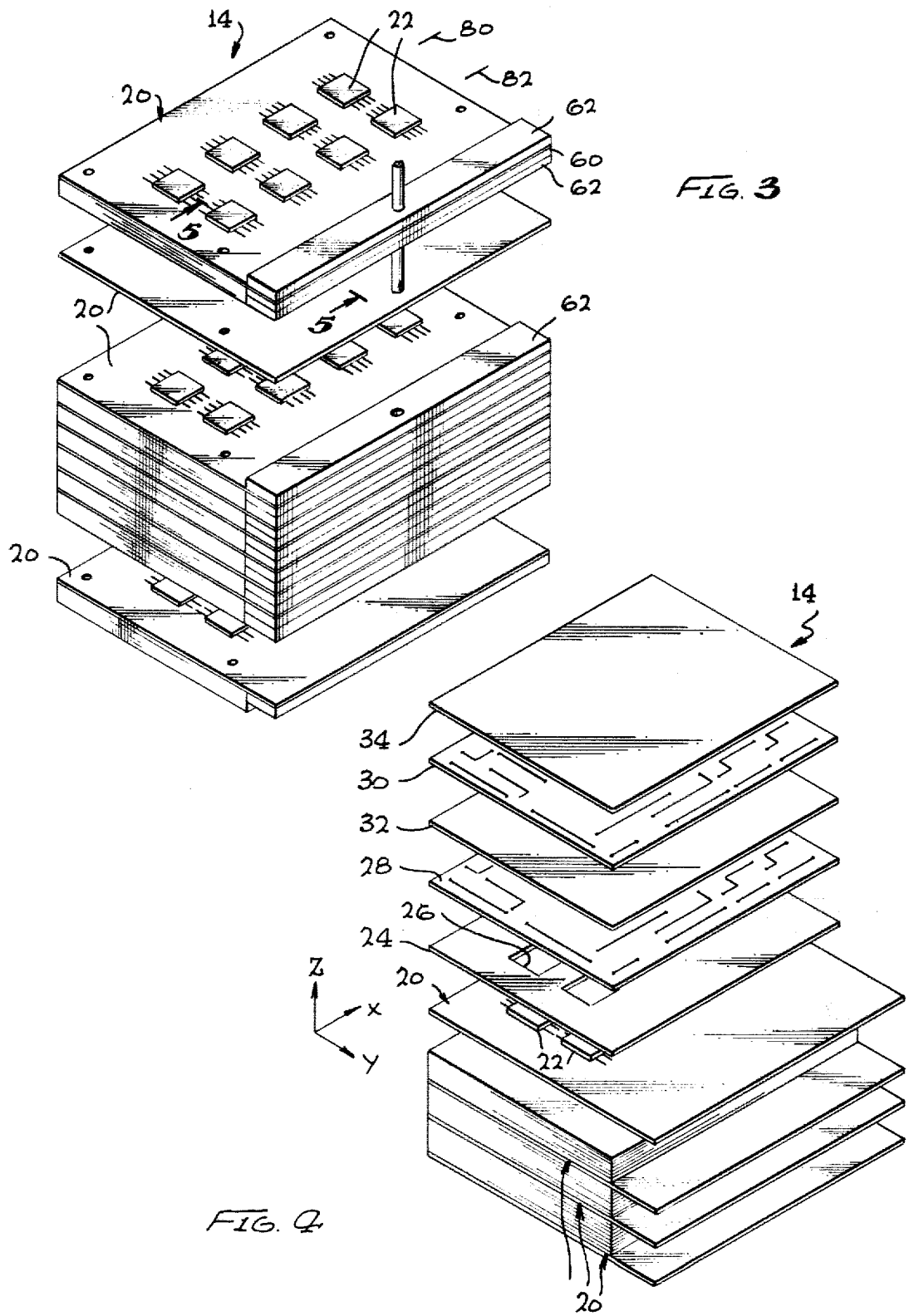

COOLING SYSTEM FOR MULTIWAFER HIGH DENSITY CIRCUIT

BACKGROUND OF THE INVENTION

Extremely high density packaging of microelectronic circuits is useful not only in saving space, but also in reducing signal path length to increase the speed of the circuit, particularly in the construction of very large and high speed computers. One technique which has been developed to provide extremely high density packaging, described in U.S. Pat. No. 3,917,983, utilizes stacks of wafers to mount and interconnect a large number of miniature integrated circuit devices, in a three-dimensional arrangement that minimizes the average signal path length between the devices. This technique utilizes several component-mount wafers in each stack that each support and connect to several micro-circuit devices, and several intermediate connection wafers disposed between the component mount wafers to provide interconnect signal paths in the X, Y, and Z directions.

Although a device packaged in accordance with the aforecited U.S. Pat. No. 3,917,983 has inherently good heat dissipation characteristics attributable primarily to the use of metal wafers, nevertheless as packaging densities increase, heat dissipation can become an important problem. A stack with perhaps nine levels of circuit devices may have an external heat-dissipating area of perhaps only twice that of a single level, so that air blowers cannot easily dissipate the heat. Furthermore, the dissipation of heat from circuit devices located at the middle of the stack can be difficult, and, of course, all of the circuit devices must be cooled below a performance-degrading temperature regardless of general heat dissipation from the entire stack. A cooling apparatus which could efficiently dissipate large quantities of heat from a stack containing heat-generating circuit devices at multiple levels therein, to cool even those circuit devices at the center of the stack to a moderate temperature, would be of considerable aid in the design of very high density circuits. It is also desirable that any such cooling apparatus itself be compact, so that a large number of stacks can be placed close together to minimize the spacing between adjacent stacks, to thereby minimize the time required for signals to pass between the stacks.

SUMMARY OF THE INVENTION

The present invention is directed to an improved arrangement and method for dissipating heat from a wafer stack carrying and interconnecting one or more heat generating micro-circuit devices. The invention is primarily based on the recognition that heat can be readily dissipated from the stack by forming good heat conductive paths from the microcircuit device to an edge of the wafer and then thermally coupling the edge to a cooling fluid transported therepast.

In accordance with one embodiment of the present invention, a high density arrangement of integrated circuit devices is provided, which effectively cools all of the circuit devices located in a multi-level stack. The high density arrangement includes a stack of wafers, including several component mount wafers that are dispersed through the stack and that hold microcircuit devices, and additional connect wafers between the component mount wafers for making X, Y, and Z interconnections. The component mount wafers, or wafers adjacent thereto, are constructed primarily of metal and have overhanging edge portions at one side of the stack that extend beyond the edges of other wafers of the stack. At least one fluid conduit extends along the same side of the stack and is clamped in close thermal contact with the overhanging edge portions, to provide a low resistance thermal path for the transference of heat from the overhanging wafer portions to cooling fluid in the conduit. The fact that some of the overhanging edge portions are parts of wafers lying in the middle of the stack, results in the direct and efficient transference of heat from circuit devices lying at the middle of the stack to the cooling fluid conduit, to not only dissipate large amounts of heat by to also assure that the dissipation is evenly distributed throughout the height of the stack.

The novel features of the invention are set forth with particularity in the appended claims. The invention will be best understood from the following description when read in conjunction with the accompanying drawings.

BRIEF DESCRIPTION OF THE DRAWINGS

FIG. 3 is a partial perspective and exploded view of one of the stacks of the circuit of FIG. 1.

FIG. 4 is a partial exploded view of a portion of the stack of FIG. 3.

DESCRIPTION OF THE PREFERRED EMBODIMENTS

Figure 1:
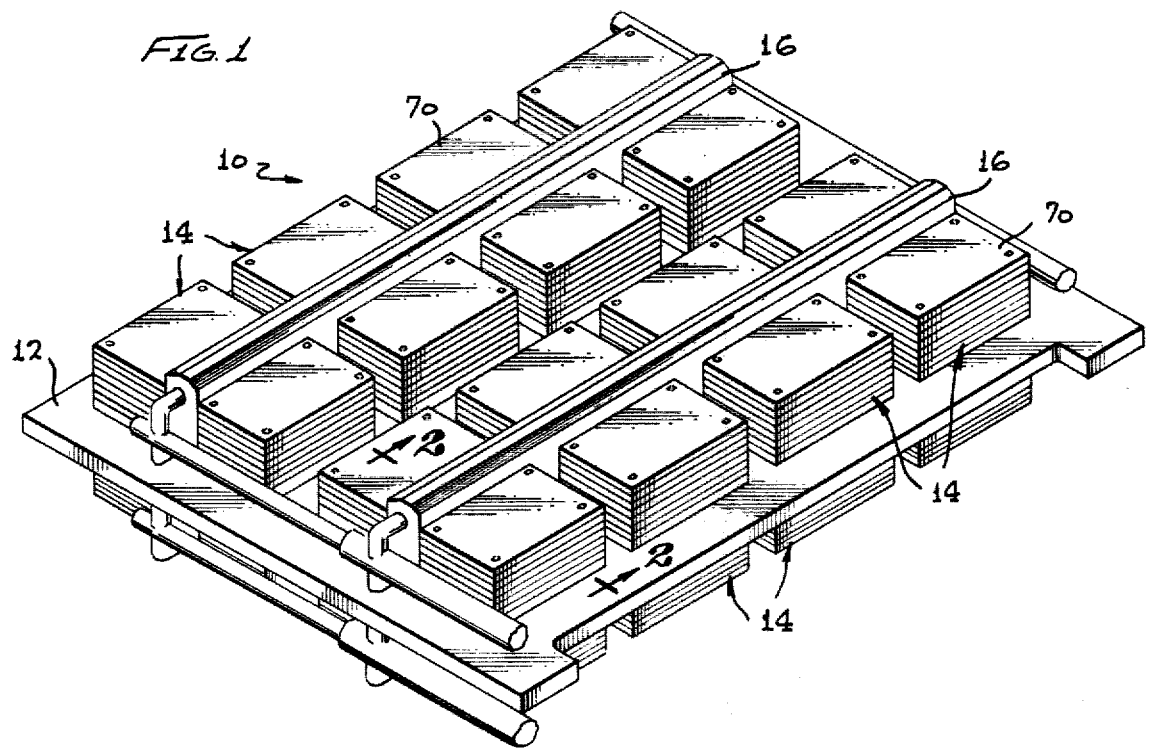
FIG. 1 is a perspective view of a multi-stack high density circuit constructed in accordance with one embodiment of the present invention.

FIG. 1 illustrates a circuit array 10 which includes a mother board 12 that supports and interconnects thirty-two stacks 14, there being sixteen stacks on each side. Each of the stacks 14 includes a large number of wafers, including nine wafers dispersed through the stack that each support eight micro-electronic devices, for a total of seventy-two of such devices per stack. A cooling arrangement for the array includes fluid conduits 16 that extend beside the stacks and that carry a cooling fluid or liquid such as water to carry away the heat generated by the stacks, substantially all of the heat being generated by the micro-circuit devices.

FIG. 3 illustrates a major portion of one of the stacks 14, showing some of the component mount and heat transfer wafers 20 thereof and the group of micro-circuit devices 22 mounted on each of these wafers. The particular stack of FIG. 3 includes nine of such component mount-heat transfer wafers 20, each holding eight micro-circuit devices. As shown in FIG. 4, several additional connect wafers are utilized in the stack between the component mount wafers 20. One of the wafers 24 is a spacer or filler wafer which has holes 26 that receive the micro-circuit devices 22 on the component mount wafers. The stack includes several other connection wafers that all aid in making connections along the height or Z axis of the stack, including a pair of interconnection wafers 28, 30 that includes signal paths extending in the X and Y axes of the stack and vertical connection wafers 32, 34 that provide signal paths only along the height of Z axis of the stack. It may be noted that the terms vertical height or Z axis herein refer to the stacking direction and not to the orientation of the stack with respect to the ground.

Figures 6, 7, 8:
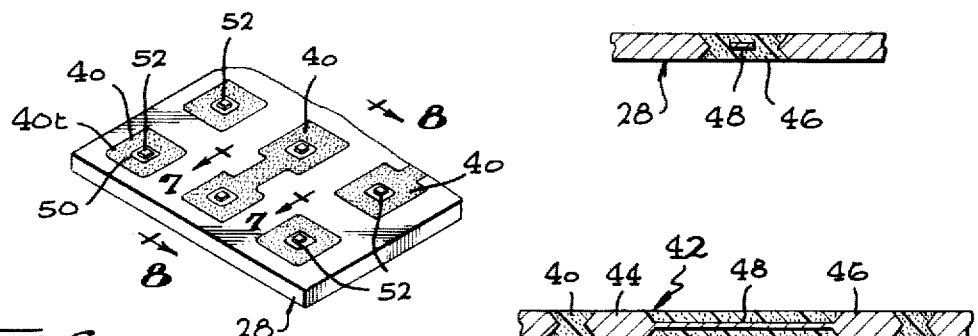
FIG. 6 is a partial perspective view of one of the interconnect wafers of FIG. 5.
FIG. 7 is a view taken on the line 7—7 of FIG. 6.
FIG. 8 is a view taken on the line 8—8 of FIG. 6.

Each of the wafers such as 28 shown in FIGS. 6-8, is constructed primarily of a thin plate of highly electrically conductive material such as copper. Separate conductors are formed by etching away small regions of the plate and filling these regions with dielectric 40, to leave a conductor such as 42 (FIG. 8) which is isolated from the rest of the plate. The particular conductor 42 has a pair of pads 44, 46 connected together by a thin buried strip 48, to carry a signal laterally, or in the X direction. Other pads such as that shown at 50 (FIG. 6) comprise a square pad of metal completely surrounded by a tube 40t of the dielectric 40, to form a simple vertical through connection through the wafer. The shielding connect wafers 32, 34 are provided to shield the thin strips 48, to thereby provide coaxial conductors for the signals.

Figure 9:
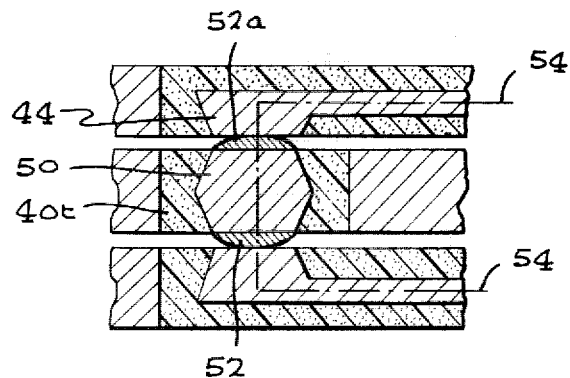
FIG. 9 is a partially sectional side view of a portion of the stack of FIG. 5.

The stack of wafers are interconnected by the use of buttons 52 of malleable conductive material such as gold, which are utilized as shown in FIG. 9 to provide a signal path 54. Each button such as 52a lies between a pair of pads 44, 50 to connect them together in a mannner that requires only a very slight separation of the wafers from one another. In order to assure good connections, the stack of wafers must be highly compressed, to deform the malleable metal buttons 52 into relatively wide area contact with the pads. It may be noted that the buttons 52 are formed as raised portions of the pads such as 50.

Figure 2:
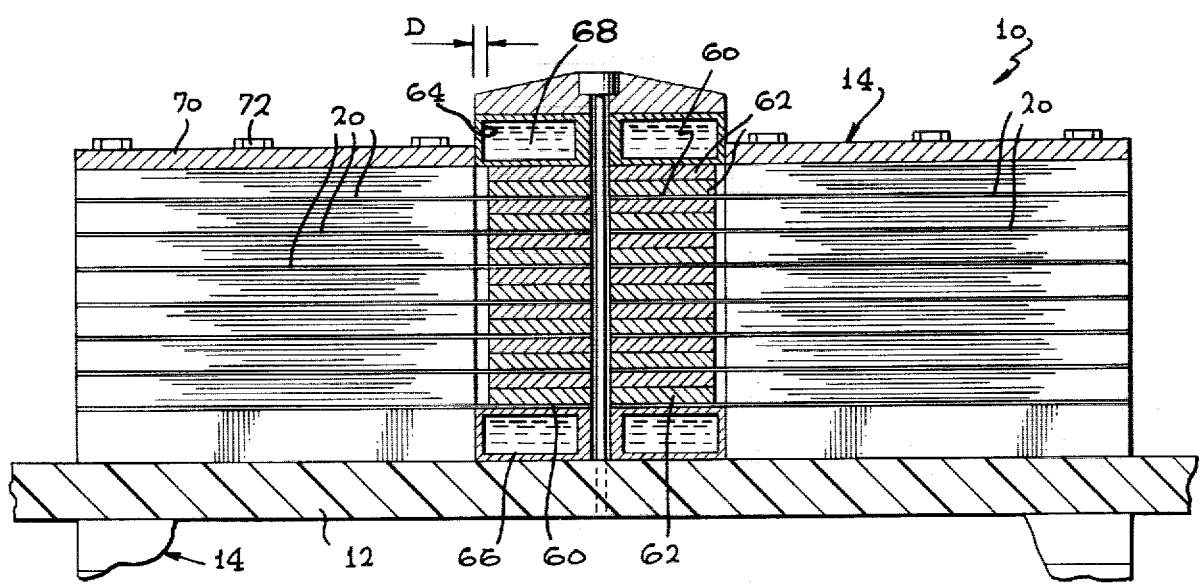
FIG. 2 is a view taken on the line 2—2 of FIG. 1.
Figure 5:
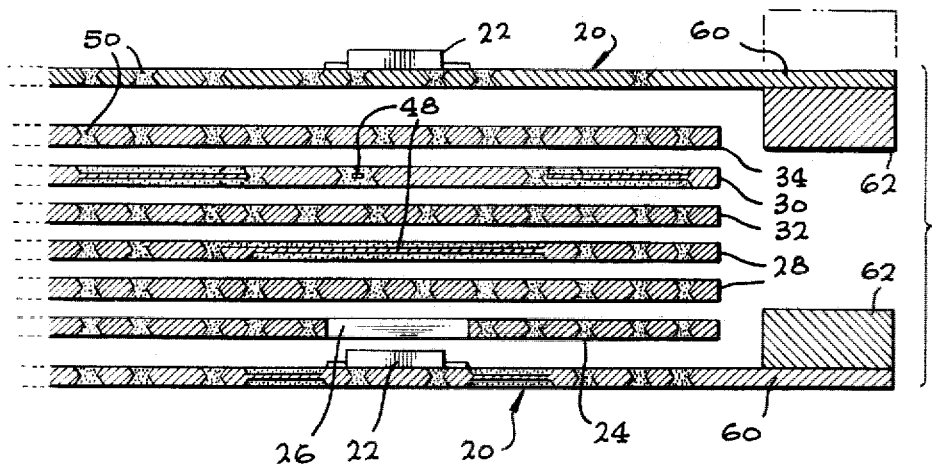
FIG. 5 is a view taken on the line 5—5 of FIG. 3.

Cooling of the stack, and particularly of the micro-circuit devices 22, is enhanced by forming the component mount wafers 20 with overhanging edge portions 60, as best shown in FIG. 5. The overhanging edge portions 60 extend to one side of the stack beyond the edges of at least some of the other wafers, to form a spaced pile of overhanging edge portions wherein the edge portions are spaced facewise from one another. Heat pads 62 of highly thermally conductive material such as copper are soldered to the overhanging edge portions 60. As shown in FIG. 2, the vertical arrangement of overhanging edge portions 60 and heat pads 62 are tightly clamped together and to a pair of cooling fluid or liquid conduits 64, 66 to provide a close thermal connection between the cooling fluid or liquid 68 in the fluid conduits and the overhanging edge portions 60 of the component mount wafers 20. Heat from any of the micro-circuit devices 22 (FIG. 3) can flow into the mount wafer 20, to the overhanging edge portion 60 of that wafer, and through the heat pads 62 to the cooling liquid conduits, to efficiently dissipate heat even from micro-circuit devices lying deep within the stack. Each of the micro-circuit devices 22 can be soldered to corresponding conductors formed in the component mount wafer 20 in the manner shown in FIG. 8, so that there is a good thermal path from the micro-circuit device through the conductor formed in the wafer, and from that conductor through the thin and intimately adjacent dielectric 40 to the surrounding metal plate of the wafer. Most of the wafer 20 is formed of metal such as copper, so that heat is efficiently conducted therethrough to the overhanging edge 60. Thus, the stack arrangement with overhanging edges clamped to cooling liquid conduits, provides an efficient arrangement for the removal of heat from all micro-circuit devices of the stack.

As discussed above, the connections between wafers can be made by malleable metal buttons which must be compressed to flatten them into good contact with conductors of the wafers. As shown in FIG. 2, this is accomplished by the use of an upper pressure plate 70 and numerous clamping screws 72 which extend through the stack to hold it in compression. The screws 72 are tightened to apply a high gold button force such as 20,000 psi to compress the gold buttons, but without damaging the wafer stack. A separate clamping arrangement is provided to clamp the liquid coolant conduits 64, 66 to the overhanging wafer edge portions 60. A separation distance D is provided between the nonoverhanging edge of the stack and the heat pads 62.

The separate clamping of the stack and the liquid conduit, and the spacing D, permits a slightly different vertical separation of the component mount wafers from one another where they are separated by the heat pads 62 as compared to where they are separated by other wafers and the gold buttons. The horizontal separation D permits slightly greater or lesser compression of the wafers 20 between the liquid conduits 64, 66 than under the pressure plate 70, without causing shearing off of the overhanging wafer edge portions 60. The thicknesses of heat pad material of the pads 62 lying between the edge portions 60 is chosen to substantially equal the separation of the mount wafers within the stack, to cause minimal bending of the overhanging wafer portion 60, taking into consideration the thicknesses of the connection wafers lying between the component mount wafers 20 and the thicknesses of the gold buttons after they have been compressed.

As shown in FIG. 3, the micro-circuit devices 22 are arranged in columns and rows, with two rows 80, 82 extending parallel to the overhanging edges 60 of the mount wafers, and with four columns perpendicular to the length of the overhanging edges 60. This arrangement results in only two devices 22 lying in series along a heat path leading to the overhanging edge portion 60, to thereby minimize heating of the micro-circuit devices. If, on the other hand, there were four rows parallel to the overhanging edges 60, then there would be four micro-circuit devices lying in series along any heat path extending perpendicular to the edges 60, and those devices furthest from the overhanging edges 60 might be heated to excessive temperatures. It would be possible to have only a single row such as 82 with eight devices 22 arranged therealong, but this has the disadvantage of providing a less efficient use of available space.

Figure 10:
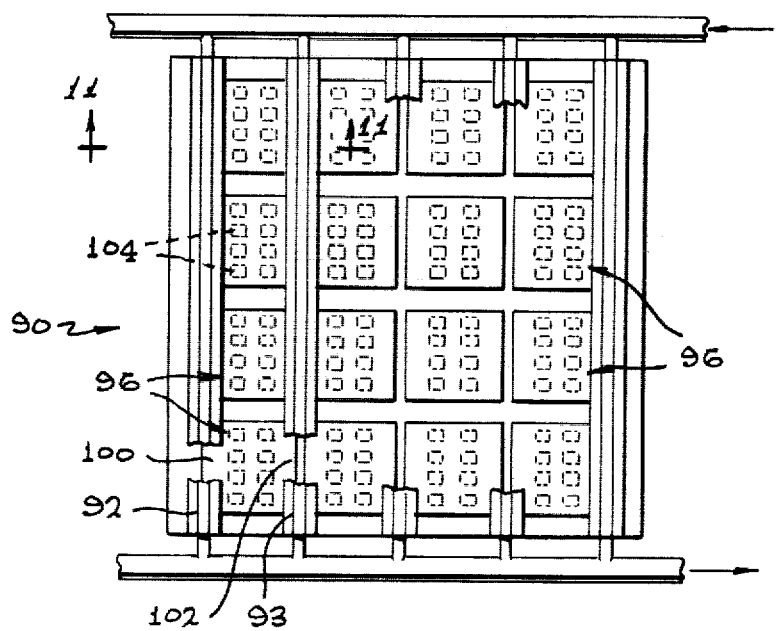
FIG. 10 is a plan view of a multi-stack array constructed in accordance with another embodiment of the present invention.
Figure 11:
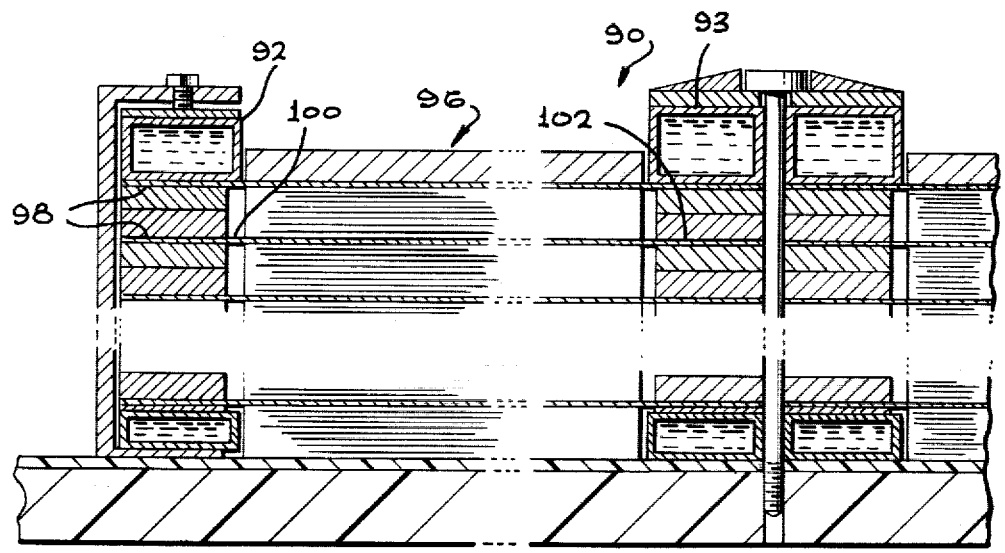
FIG. 11 is a view taken on the line 11—11 of FIG. 10.

FIGS. 10 and 11 illustrate another matrix arrangement 90 similar to that of FIGS. 1-9, except that cooling liquid conduits such as 92 and 93 are provided to extend along both edges of the stacks 96 instead of only one edge. In this arrangement, each of the component mount wafers 98 are provided with overhanging edge portions 100, 102 at opposite sides of the stack, and each edge portion is thermally coupled to a different liquid tube 92, 93. Where the micro-circuit devices 104 are mounted in only two rows, as indicated in FIG. 10, each micro-circuit device is provided with a separate thermal path leading to one of the liquid conduits. This avoids the possibility of overheating the last in a seried of micro-circuit devices that all lie in series along a thermal path.

Figure 12:
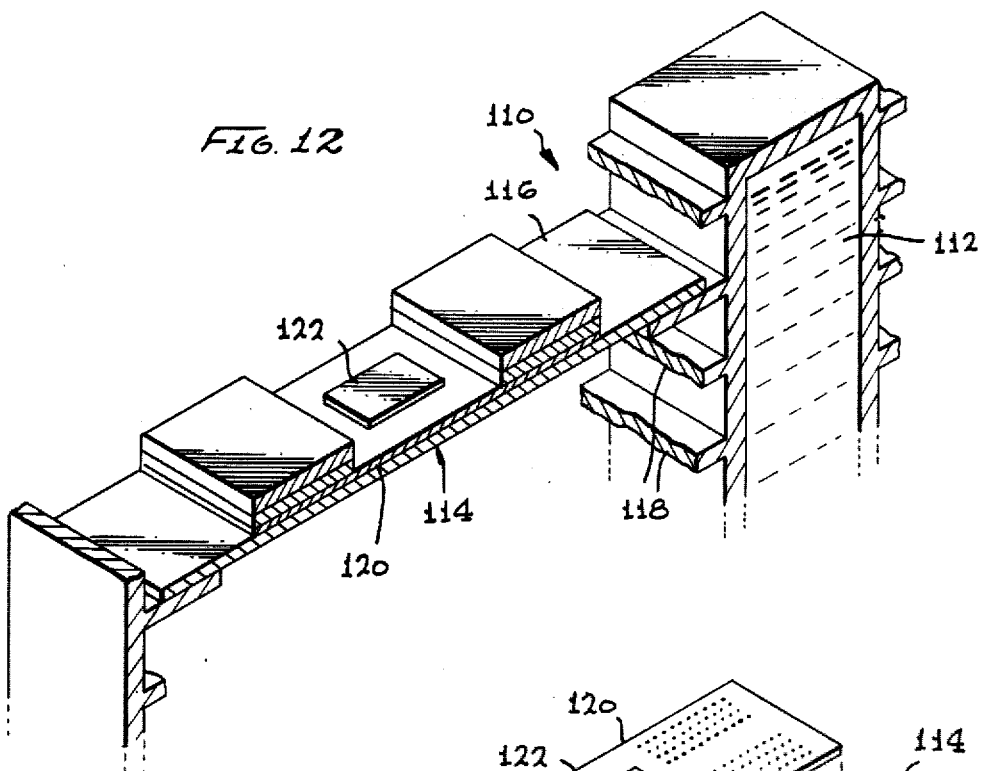
FIG. 12 is a partial perspective view of a circuit arrangement constructed in accordance with another embodiment of the invention.
Figure 13:
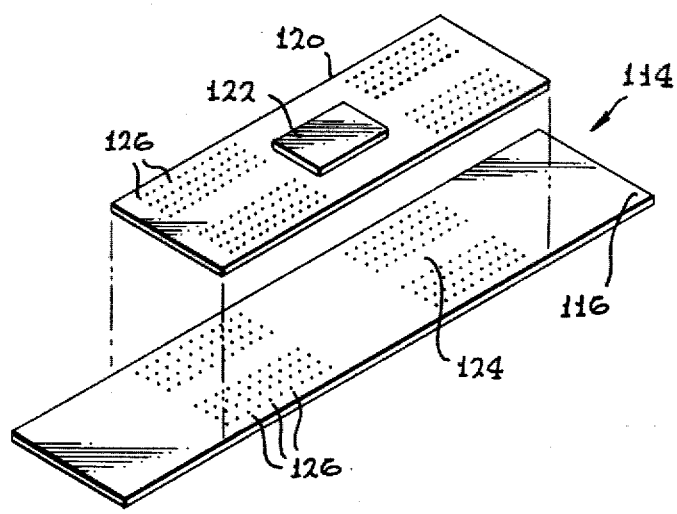
FIG. 13 is a partial exploded view of the arrangement of FIG. 12.
Figure 14:
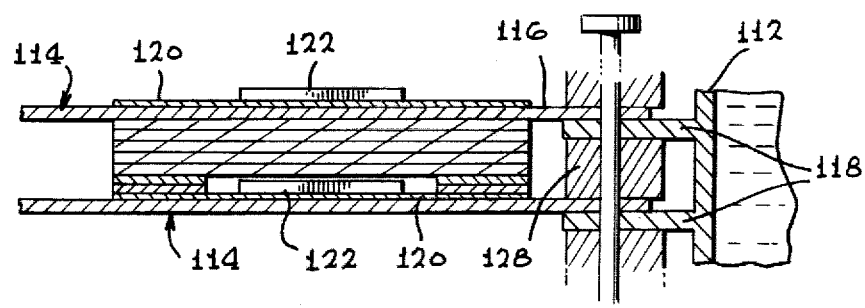
FIG. 14 is a sectional side view of a portion of the arrangement of FIG. 12.

FIGS. 12-14 illustrate another arrangement for enhancing the cooling of micro-circuit devices. This arrangement 110 includes a cooling liquid conduit 112 that extends beside the stack of wafers, instead of utilizing cooling liquid conduits that are clamped at the top and/or bottom of the overhanging wafer portions. Thus, a wafer 114 is provided with an overhanging edge portion 116, and the liquid conduit 112 is provided with numerous fins 118 that lie between the overhanging edge portions 116 and are clamped in thermal contact with them. It may be noted that the wafer 114 is a separate heat transfer wafer which is in direct thermal and electrical contact with a component mount wafer 120 on which micro-circuit devices 122 are mounted.

The wafer 114 with overhanging edge portions can be constructed primarily of metal, even though it includes numerous tiny contact pads surrounded by dielectric, to provide good heat conduction. However, further heat transfer capability can be provided by leaving a solid metal path 124 (FIG. 13) along the shortest path from the location of the micro-circuit chip 122 and the cooling liquid conduit 112. The electrical conductors 126 of the type shown in FIG. 6 which include miniature conductive pads surrounded by dielectric material, are placed on either side of the path 124 shown in FIG. 13. This provides a cross-section along the thermal path, which is almost 100% metal. As shown in FIG. 14, holes are provided in the overhanging wafer edge portion 116, in the fins 118, and in spacer heat pads 128 placed in series with the fins and wafer portions. The heat pads 128 are provided to enable relatively thin fins to be utilized that can flex slightly when the fins are clamped to the wafer portions. Although this arrangement provided a highly direct heat transference to cooling liquid, it has disadvantages in the assembling of the stacks. That is because the overhanging wafer edge portions 116 have to be interleaved with the fins 118 of the cooling liquid tubes.

Thus, the invention provides a high density, three dimensional arrangement of micro-circuit devices, having an efficient cooling apparatus that not only carries away large amounts of heat but assures that even those micro-circuit devices deep within the stack are adequately cooled. This is accomplished by utilizing wafers formed primarily of metal, so their cross-section is primarily metal along direct thermal paths to a cooling liquid conduit, by utilizing such wafers to directly support the micro-circuit devices or to be in direct thermal contact with such a support, and by forming those wafers with overhanging edge portions that are closely thermally coupled to tubes that carry cooling liquid. The arrangement provides a good thermal path between the cooling liquid and even those devices deep within the stack. It may be noted that a large number of different types of micro-circuit packages are available, including those with leads and those without, and substantially al of such packages can be utilized provided care is taken to provide good thermal coupling between the packages and the supporting wafers. The cooling liquid tubes can be clamped to the overhanging wafer edge portions utilizing a clamping arrangement separate from that utilized to hold the rest or middle portion of the stack together, to account for slight differences in the degree of compression of the main stack portion wherein the wafers may be separated by malleable metal contact buttons. The cooling liquid tubes can lie at the top and/or bottom of the stack of overhanging edge portions, so that the tubes can be easily applied after the stack of wafers has been assembled. In another arrangement, the tube can lie beside the wafer edges, and with fins on the tube connected by clamping or other means to the overhanging wafer edge portions. The micro-circuit devices are arranged in rows and columns on each mount wafer, and with a smaller number of rows parallel to the overhanging edge portions than the perpendicularly-extending columns, so that there are a minium number of micro-circuit devices located in series along a direct thermal path to the overhanging edge portions.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. A high density arrangement of integrated circuit devices comprising:
   a stack of wafers including a plurality of component mount wafers formed primarily of metal and having overhanging edge portions along one side of the stack which extend beyond the side edges of other wafers of the stack, and a plurality of connect wafers disposed between said mount wafers, at least some of the adjacent wafers having through-wafer connections comprising a metal pad surrounded by a tube of dielectric material which is, in turn, surrounded by metal, and a multiplicity of said connection pads of adjacent wafers being aligned;
   a multiplicity of button portions of malleable metal disposed between the connection pads of adjacent wafers;
   a cooling arrangement including a field conduit extending along said one side of said stack;
   a first clamp arrangement holding a portion of said stack inside said overhanging edges, in sufficient compression to deform said button portions into low resistance contact with said pads; and
   a second clamp arrangement holding said fluid conduit arrangement in tight thermal coupling to said overhanging mount wafer portions.

2. The high density arrangement described in claim 1 wherein:
   said cooling arrangement includes metal heat pads lying between the overhanging wafer edge portions; and
   at least some of said wafers without overhanging edge portions, have substantially aligned edges spaced from said metal heat pads, whereby to enable slight differences in thickness after compression, of the stack portion which comprises button-separated wafers and of the metal pad-separated overhanging wafer edge portions.

3. A high density arrangement of integrated circuit devices comprising:
- a multiplicity of wafers lying parallel to one another and electrically interconnected;
- a plurality of integrated circuit devices mounted on certain of said wafers;
- means clamping said wafers into a tight stack;
- said stack including a plurality of spaced heat transfer wafers having overhanging edge portions extending beyond other wafers in said stack along a predetermined side thereof; and
- conduit means secured relative to said stack for transporting a fluid past said overhanging edge portions in closely thermally coupled relationship therewith;
- said conduit means having a plurality of fins interleaved with said overhanging edge portions and thermally coupled thereto.

4. A high density arrangement of integrated circuit devices comprising:
- a multiplicity of wafers lying parallel to one another and electrically interconnected;
- a plurality of integrated circuit devices mounted on certain of said wafers;
- means clamping said wafers into a tight stack;
- said stack including a plurality of spaced heat transfer wafers having overhanging edge portions extending beyond other wafers in said stack along a predetermined side thereof and forming a spaced pile with top and bottom ends;
- a fluid conduit disposed at an end of the spaced pile of overhanging edge portions; and
- a plurality of heat pads of highly thermally conductive material disposed between and in thermal contact with said overhanging heat transfer wafer edge portions, the thickness of heat pad material lying between a pair of said wafers which have adjacent but spaced overhanging edge portions being of substantially the same thickness as the space between said pair of wafers in said stack.

5. The arrangement described in claim 4 including:
- second means clamping said heat pads, said overhanging wafer edge portions, and said fluid conduit together, independently of said first mentioned clamping means.

6. A high density arrangement of integrated circuit devices comprising:
- a multiplicity of wafers arranged in a stack and electrically interconnected;
- a plurality of integrated circuit devices mounted on certain of said wafers;
- said wafers including a plurality of heat transfer wafers formed primarily of highly thermally conductive material, being closely thermally coupled to corresponding circuit devices, and having overhanging edge portions at a predetermined side of the stack;
- a fluid conduit secured relative to said stack and extending along said predetermined side of said stack;
- first clamp means clamping said wafers into a tight stack at a location spaced from said overhanging edge portions; and
- second clamp means clamping said fluid conduit to said overhanging heat transfer wafer edge portion in close thermal coupling therewith independently of said first clamp means.

* * * * *